(12) United States Patent    (10) Patent No.:     US 8,766,233 B2
    Sakotsubo et al.          (45) Date of Patent:    Jul. 1, 2014

(54) SEMICONDUCTOR DEVICE WITH VARIABLE RESISTANCE ELEMENT AND METHOD FOR MANUFACTURING THE SAME

(75) Inventors: Yukihiro Sakotsubo, Tokyo (JP); Masayuki Terai, Tokyo (JP); Munehiro Tada, Tokyo (JP); Yuko Yabe, Tokyo (JP); Yukishige Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/499,956

(22) PCT Filed: Oct. 4, 2010

(86) PCT No.: PCT/JP2010/067706
    § 371 (c)(1),
    (2), (4) Date: Jun. 6, 2012

(87) PCT Pub. No.: WO2011/043448
    PCT Pub. Date: Apr. 14, 2011

(65) Prior Publication Data
    US 2012/0267598 A1    Oct. 25, 2012

(30) Foreign Application Priority Data
    Oct. 9, 2009    (JP) ................... 2009-234810

(51) Int. Cl.
    *H01L 47/00*    (2006.01)
(52) U.S. Cl.
    USPC ............ 257/4; 257/E47.001; 257/E21.004; 438/382
(58) Field of Classification Search
    USPC ............ 257/4, E47.001, E21.004; 438/382
    See application file for complete search history.

(56) References Cited

U.S. PATENT DOCUMENTS 7,060,586 B2 *   6/2006   Li et al. ................... 438/385
7,417,271 B2 *   8/2008   Genrikh et al. ............ 257/289
                         (Continued)

FOREIGN PATENT DOCUMENTS

| JP | 2009-105383 | 5/2009 |
| JP | 2009-130344 | 6/2009 |
| JP | 2009-135370 | 6/2009 |
| WO | WO 2009/147790 | 12/2009 |

OTHER PUBLICATIONS

Z. Wei, Highly Reliable TaOx ReRAM and Direct Evidence of Redox Reaction Mechanism, IEDM Technical Digest, IEEE, 2008, 293.
International Search Report, PCT/JP2010/067706, Dec. 28, 2010.

*Primary Examiner* — Kimberly Rizkallah
*Assistant Examiner* — Caleb Henry
(74) *Attorney, Agent, or Firm* — Young & Thompson

(57) ABSTRACT

A semiconductor device includes at least first and second electrodes, and a layer including a transition metal oxide layer sandwiched between the first and second electrodes. The transition metal oxide layer includes first and second transition metal oxide layers formed of different first and second transition metals, respectively. The first transition metal oxide layer is provided on the first electrode side, the second transition metal oxide layer is provided on the second electrode side, the first transition metal oxide layer and the second transition metal oxide layer are in contact with each other, the first transition metal oxide layer has an oxygen concentration gradient from the interface between the first transition metal oxide layer and the second transition metal oxide layer toward the first electrode side, and the oxygen concentration at the interface is greater than the oxygen concentration on the first electrode side.

8 Claims, 19 Drawing Sheets

(56) References Cited

U.S. PATENT DOCUMENTS

| | | | |
|---|---|---|---|
| 7,521,704 B2* | 4/2009 | Lee et al. | 257/2 |
| 7,538,338 B2* | 5/2009 | Rinerson et al. | 257/4 |
| 7,635,628 B2* | 12/2009 | Khang et al. | 438/264 |
| 7,678,607 B2* | 3/2010 | Chiang et al. | 438/104 |
| 7,704,789 B2* | 4/2010 | Sun et al. | 438/104 |
| 7,764,160 B2* | 7/2010 | Kawano et al. | 338/20 |
| 7,829,930 B2* | 11/2010 | Terao et al. | 257/314 |
| 7,923,711 B2* | 4/2011 | Shima et al. | 257/2 |
| 7,972,897 B2* | 7/2011 | Kumar et al. | 438/104 |
| 8,058,636 B2* | 11/2011 | Osano et al. | 257/2 |
| 8,188,466 B2* | 5/2012 | Kawano et al. | 257/43 |
| 8,227,782 B2* | 7/2012 | Noshiro | 257/2 |
| 8,294,219 B2* | 10/2012 | Malhotra et al. | 257/382 |
| 2005/0245039 A1* | 11/2005 | Li et al. | 438/385 |
| 2005/0247921 A1* | 11/2005 | Lee et al. | 257/2 |
| 2006/0054950 A1* | 3/2006 | Baek et al. | 257/295 |
| 2006/0098472 A1* | 5/2006 | Ahn et al. | 365/145 |
| 2007/0215977 A1* | 9/2007 | Lee et al. | 257/536 |
| 2008/0001172 A1* | 1/2008 | Karg et al. | 257/194 |
| 2008/0011996 A1* | 1/2008 | Bednorz et al. | 257/2 |
| 2009/0014770 A1* | 1/2009 | Terao et al. | 257/314 |
| 2009/0121823 A1* | 5/2009 | Kawano et al. | 338/20 |
| 2009/0230391 A1* | 9/2009 | Noshiro | 257/43 |
| 2009/0273964 A1* | 11/2009 | Yamazaki et al. | 365/148 |
| 2010/0038791 A1* | 2/2010 | Lee et al. | 257/758 |
| 2010/0117053 A1* | 5/2010 | Sekar et al. | 257/4 |
| 2010/0117069 A1* | 5/2010 | Sekar et al. | 257/43 |
| 2010/0259966 A1 | 10/2010 | Kanzawa et al. | |
| 2011/0006275 A1* | 1/2011 | Roelofs et al. | 257/2 |
| 2012/0132882 A1* | 5/2012 | Seo et al. | 257/4 |

\* cited by examiner

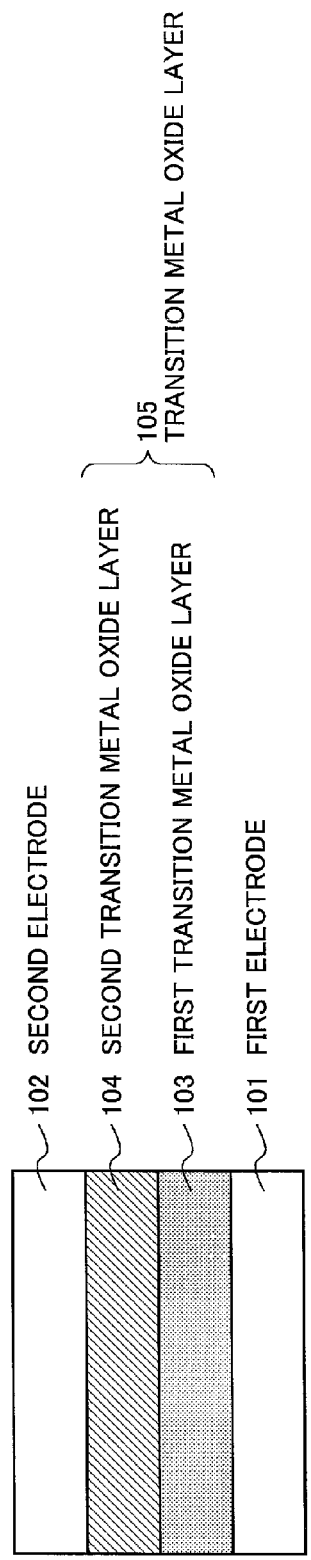

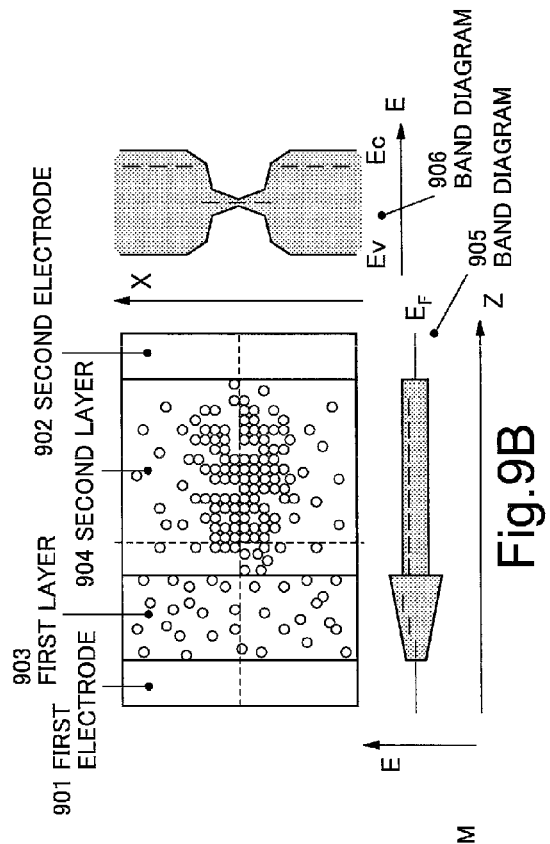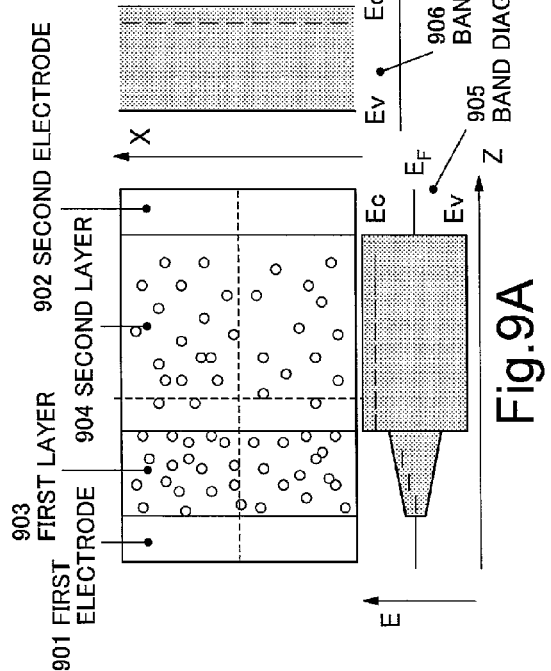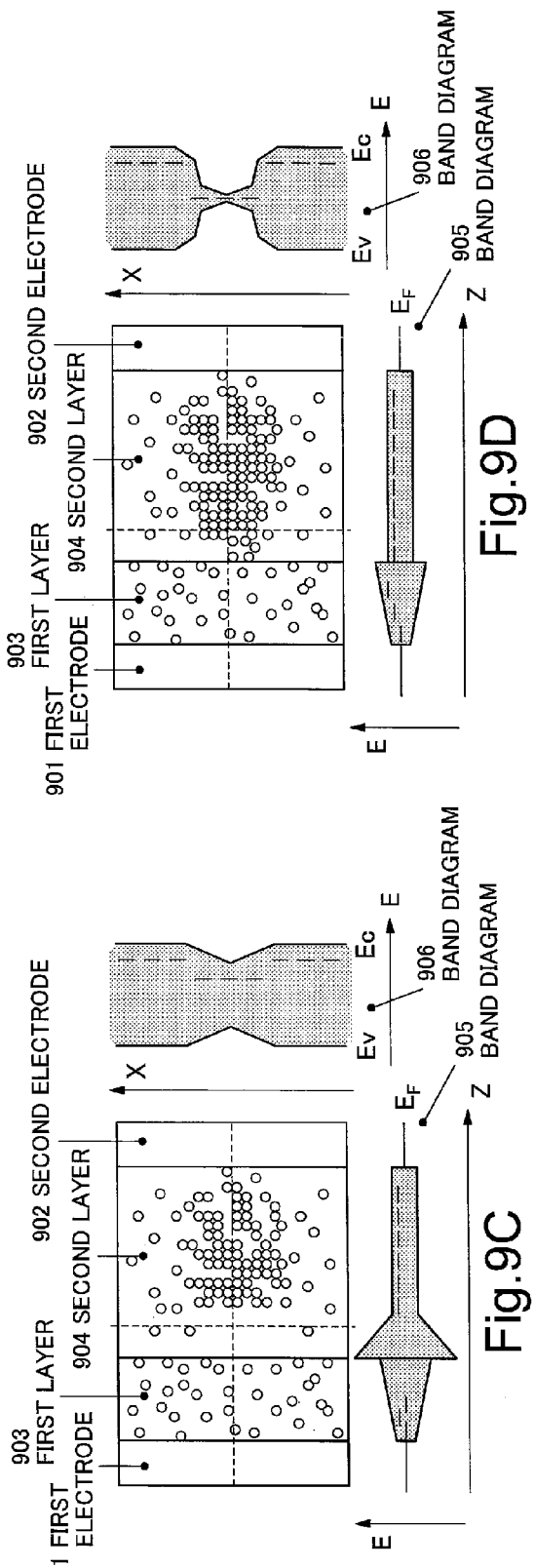

SEMICONDUCTOR DEVICE WITH VARIABLE RESISTANCE ELEMENT AND METHOD FOR MANUFACTURING THE SAME

TECHNICAL FIELD

The present invention relates to a semiconductor device having a variable resistance element and a method for manufacturing the same.

BACKGROUND ART

In a non-volatile memory field, many studies have been conducted on especially flash memory and also ferroelectric memory (FeRAM), MRAM (Magnetic RAM), OUM (Ovonic Unified Memory), and the like.

In recent years, a Resistance Random Access Memory (ReRAM) different from these non-volatile memories has been proposed. Information can be written into ReRAM by setting a resistance value of a variable resistance layer of a memory cell by applying a voltage pulse and read out information without destruction. With respect to the ReRAM, the cell area is small and a multivalued memory can be realized. Therefore, it is recognized that there is a possibility that the ReRAM will have performance exceeding that of the existing non-volatile memory.

In a status in which it is absolutely necessary to process a great number of information, the ReRAM in which a large volume data can be read and written at low power consumption, high reliability, and high speed is needed. In order to realize this ReRAM, the various technologies are proposed for the variable resistance layer used for the ReRAM (patent document 1 and non-patent document 1).

In patent document 1, a non-volatile element using the variable resistance layer composed of a tantalum oxide layer and a transition metal oxide layer that is formed of a metal different from tantalum is disclosed. In non-patent document 1, the variable resistance element using a tantalum oxide layer having an oxygen concentration gradient across the layer from an interface with one electrode layer to an interface with the other electrode layer as the variable resistance layer is disclosed. Further, it is described that the resistance change described in non-patent document 1 occurs when the oxygen atoms gather at the vicinity of the interface between the electrode layer and the tantalum oxide layer and diffuse by the electric field.

PRIOR ART DOCUMENT

Patent Document patent document 1: Japanese Patent Application Laid-Open No. 2009-135370

Non-Patent Document non-patent document 1: IEDM Technical Digest and 2008, page 293

BRIEF SUMMARY OF THE INVENTION

Problems to be Solved by the Invention

However, the non-volatile element described in patent document 1 has the following problems. The non-volatile element described in patent document 1 has a laminated structure formed of tantalum oxide and titanium oxide and the both transition metal oxide layers have no oxygen concentration gradient.

In a case in which the laminated structure is composed of the transition metal oxide layers, each of which is formed of different metal, as a mechanism of the resistance change, a state in which the oxygen concentration gradient is established in one of the transition metal oxide layers occurs when the voltage is applied. Finally, when the oxygen reaches the other transition metal oxide layer, the resistance change occurs. However, the transition metal oxide layer described in patent document 1 does not have the oxygen concentration gradient. Therefore, a problem in which an excessive voltage is needed until the oxygen reaches the other transition metal oxide layer occurs. Therefore, a problem in which an excessive voltage is required until the oxygen reaches the other transition metal oxide layer and large power is consumed occurs.

On the other hand, in non-patent document 1, the non-volatile element with the oxygen concentration gradient is disclosed. However, the non-volatile element described in non-patent document 1 has the following problems. In the non-volatile element described in non-patent document 1, the oxygen concentration gradient exists from the interface with one electrode layer to the interface with the other electrode layer across the whole element. Therefore, a problem in which oxygen that gathers at the vicinity of the interface between the electrode layer and the tantalum oxide layer diffuses into the electrode layer and whereby, the stable resistance change can not be obtained occurs.

The object of the present invention is to provide a semiconductor device which can solve the above-mentioned problems, can perform a switching operation at low power consumption, and has a stable variable resistance characteristic and a method for manufacturing the same.

Means for Solving the Problems

In order to solve the above-mentioned problem, in a first aspect of the present invention, a semiconductor device in which at least a first electrode, a second electrode, and a layer including a transition metal oxide layer sandwiched between the first electrode and the second electrode are included is provided and wherein the transition metal oxide layer includes a first transition metal oxide layer formed of a first transition metal and a second transition metal oxide layer formed of a second transition metal different from the first transition metal, the first transition metal oxide layer is provided on the first electrode side, the second transition metal oxide layer is provided on the second electrode side, the first transition metal oxide layer and the second transition metal oxide layer are in contact with each other, the first transition metal oxide layer has an oxygen concentration gradient from an interface between the first transition metal oxide layer and the second transition metal oxide layer toward the first electrode side, and the oxygen concentration at the above-mentioned interface is greater than the oxygen concentration on the first electrode side.

Further, in a second aspect of the present invention, a method for manufacturing a semiconductor device which includes at least: (a) a step for forming a first transition metal oxide layer by oxidizing a first transition metal layer provided on a first electrode by plasma oxidation, (b) a step for forming a second transition metal oxide layer formed of a transition metal different from the first transition metal on the first transition metal oxide layer after the above-mentioned step (a), and (c) a step for forming a second electrode on the second transition metal oxide layer after the above-mentioned step (b) is provided.

Advantage of the Invention

By using the present invention, a semiconductor device which can perform a switching operation at low power consumption and has a stable variable resistance characteristic can be realized.

BRIEF DESCRIPTION OF THE DRAWINGS

FIG. 1 is a cross-sectional view showing an example of a semiconductor device according to an exemplary embodiment of the present invention.

FIG. 9A is a figure showing an operation of a variable resistance element according to an example 1 of the present invention. FIG. 9B is a figure showing an operation of a variable resistance element according to an example 1 of the present invention. FIG. 9C is a figure showing an operation of a variable resistance element according to an example 1 of the present invention. FIG. 9D is a figure showing an operation of a variable resistance element according to an example 1 of the present invention.

DESCRIPTION OF EMBODIMENTS

Figure 2A:
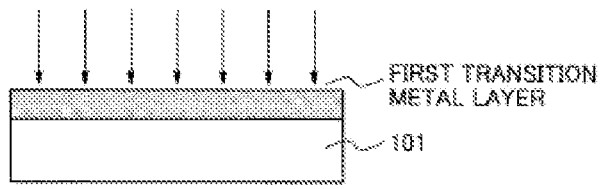
FIG. 2 is a cross-sectional view showing an example of a semiconductor device according to an exemplary embodiment of the present invention.

The meaning of the term used in the present invention will be explained before explaining the present invention in detail.

A semiconductor substrate includes a substrate such as a substrate on which a semiconductor device is configured, a single crystal substrate, an SOI (Silicon on Insulator) substrate, a TFT (Thin Film Transistor) substrate, a substrate for liquid crystal production, or the like.

A post-oxidation method is a method in which a metal thin film is formed on a substrate by using a vapor deposition method, a sputtering method, a pulse laser deposition method, or the like and the metal thin film is oxidized by using a thermal oxidation method in an oxygen atmosphere, a plasma oxidation method using an oxygen plasma, or the like to form an oxide film on the substrate.

This exemplary embodiment will be described in detail below with reference to the drawings.

FIG. 1 is a figure schematically showing a structure of a semiconductor device according to this exemplary embodiment.

The semiconductor device shown in FIG. 1 includes at least a first electrode (lower electrode) 101, a second electrode (upper electrode) 102, and a transition metal oxide layer 105 sandwiched between the first electrode 101 and the second electrode 102.

The transition metal oxide layer 105 includes a first transition metal oxide layer 103 formed of the first transition metal and a second transition metal oxide layer 104 formed of a second transition metal different from the first transition metal.

The first transition metal oxide layer 103 is provided on the first electrode 101 side and the second transition metal oxide layer 104 is provided on the second electrode side 102. The first transition metal oxide layer 103 and the second transition metal oxide layer 104 are in contact with each other.

The first transition metal oxide layer 103 has the oxygen concentration gradient from the interface between the first transition metal oxide layer 103 and the second transition metal oxide layer 104 toward the first electrode 101 side. Further, the oxygen concentration at the interface between the first transition metal oxide layer 103 and the second transition metal oxide layer 104 is greater than the oxygen concentration on the first electrode 101 side.

The semiconductor device is configured as mentioned above. Namely, the transition metal oxide layer 105 originally has the oxygen concentration gradient that is essential in a resistance change process. Therefore, a voltage required for switching operation (power consumption) can be reduced. The larger the oxygen concentration gradient is, the more the power consumption can be reduced. The first transition metal oxide layer 103 has the oxygen concentration gradient whose starting point is the interface between the first transition metal oxide layer 103 and the second transition metal oxide layer 104. Therefore, the high speed switching operation can be achieved.

Further, because the transition metal oxide layer 105 has the laminated structure composed of the transition metal oxide layers that are different from each other, the resistance change occurs at the interface between the transition metal oxide layers that are different from each other and it does not occur at the interface between the electrode layer and the transition metal oxide layer. Thus, by setting the interface between the transition metal oxide layers that are different from each other to a place (resistance change place) at which oxygen segregation easily occurs, the oxygen diffusion into the electrode layer can be suppressed and the degradation of the variable resistance characteristic caused by the oxidation of the electrode can be prevented.

In this exemplary embodiment, the transition metal is defined as elements excluding lanthanoid and actinoid among the elements belonging to groups from 3 to 11 of the periodic table of the elements. The transition metal element has a feature in which many electrons that are widely distributed outside the d orbit or the f orbit exist. This behavior means that there are many electrons which can participate in metallic bonding and there are many possible oxidation numbers.

Further, with respect to the oxygen concentration gradient, it is necessary to satisfy a condition in which the oxygen concentration at the interface between the first transition metal oxide layer 103 and the second transition metal oxide layer 104 is greater than the oxygen concentration on the first electrode 101 side. Further, it is further desirable that the oxygen concentration decreases monotonically from the interface between the first transition metal oxide layer 103 and the second transition metal oxide layer 104 to the first electrode 101 side.

It is necessary to satisfy a condition in which the oxygen concentration gradient exists from the interface between the first transition metal oxide layer 103 and the second transition metal oxide layer 104 toward the first electrode 101 side. In other words, the oxygen concentration gradient does not need to exist for the whole from the interface between the first transition metal oxide layer 103 and the second transition metal oxide layer 104 to the interface between the first electrode 101 and the first transition metal oxide layer 103.

Further, another layer other than the laminated structure composed of the first transition metal oxide layer 103 and the second transition metal oxide layer 104 may be interposed between the first electrode 101 and the second electrode 102. For example, a structure in which a layer for controlling a crystal orientation is interposed between the first electrode 101 and the first transition metal oxide layer 103 may be used.

In order to suppress unevenness of the surface of the transition metal oxide layer that is caused by a crystal grain, it is desirable that at least one of the first and second transition metal oxide layers is amorphous. It is further desirable that both the first and second transition metal oxide layers are amorphous. However, if a sufficiently flat surface can be obtained, the transition metal oxide layer may be formed of a polycrystalline material or a microcrystalline material.

At least one of the first transition metal oxide layer 103 and the second transition metal oxide layer 104 is amorphous. Therefore, the surface of the interface between the first transition metal oxide layer 103 and the second transition metal oxide layer 104 is flat. Similarly, because the first transition metal oxide layer 103 is amorphous, when the first transition metal oxide layer 103 and the first electrode 101 are in contact with each other, the surface of the interface between the first transition metal oxide layer 103 and the first electrode 101 is flat. Similarly, because the second transition metal oxide layer 104 is amorphous, when the second transition metal oxide layer 104 and the second electrode 102 are in contact with each other, the surface of the interface between the second transition metal oxide layer 104 and the second electrode 102 is flat. Therefore, variation of the variable resistance path can be reduced among the elements in comparison with a case in which the transition metal oxide layer is formed of a polycrystalline material. This is useful for realizing miniaturization (high integration) of the element.

Further, for example, when the titanium oxide layer is used as the first transition metal oxide layer 103 and the tantalum oxide layer is used as the second transition metal oxide layer 104, it is desirable that titanium oxide in the titanium oxide layer 103 is a stoichiometric composition at the interface with the tantalum oxide layer 104. Furthermore, it is desirable that the oxygen concentration of titanium oxide in the titanium oxide layer 103 is not more than 30% of the stoichiometric composition at the interface with the first electrode 101. By using the above-mentioned structure, an electric current required for the resistance change can be reduced.

It is desirable that the first transition metal oxide layer 103 is formed of any one of titanium oxide, zirconium oxide, and nickel oxide. A film thickness of for example, about 4 nm can be used.

It is desirable that the second transition metal oxide layer 104 is formed of any one of tantalum oxide, zirconium oxide, and silicon tantalum oxide. A film thickness of for example, about 15 nm can be used.

It is desirable that an absolute value of a free energy of oxidation of the second transition metal of which the second transition metal oxide layer 104 is formed is greater than that of the first transition metal of which the first transition metal oxide layer 103 is formed.

The free energy of oxidation can be read as oxygen-transition metal bond strength. Accordingly, it is supposed that the smaller the free energy of oxidation is, the more an oxygen ion or an oxygen defect is diffused. Therefore, by making the absolute value of the free energy of oxidation of the first transition metal small, the oxygen ion or the oxygen defect is largely diffused and whereby, the electric current required for the resistance change can be reduced.

The first electrode 101 has to be electrically-conductive. It may be formed of for example, gold, nickel, cobalt, platinum, ruthenium, iridium, titanium, an alloy of these metals or an oxide or a nitride of these metals, fluoride, carbide, silicide, or the like. A laminated body formed of these materials may be used.

The second electrode 102 has to be electrically-conductive. It may be formed of for example, gold, nickel, cobalt, platinum, ruthenium, iridium, titanium, an alloy of these metals or an oxide or a nitride of these metals, fluoride, carbide, silicide, or the like. Further, a laminated body formed of these materials may be used.

FIG. 2 is a figure schematically showing a step of a method for manufacturing a semiconductor device according to this exemplary embodiment.

Figure 2B:
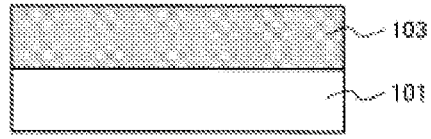
Figure 2C:
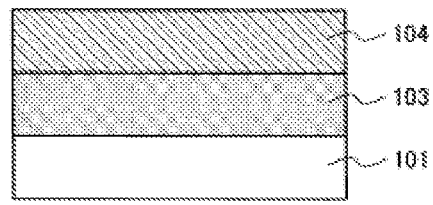
Figure 2D:
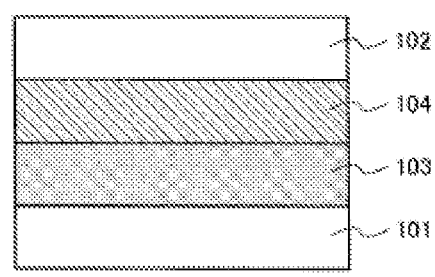

First, in a step (a), the first transition metal layer formed on the first electrode 101 (FIG. 2A) is oxidized by the plasma oxidation to form the first transition metal oxide layer 103 (FIG. 2B). In a step (b) after the step (a), the second transition metal oxide layer 104 that is formed of the transition metal different from the first transition metal is formed on the first transition metal oxide layer 103 (FIG. 2C). In a step (c) after the step (b), the second electrode 102 is formed on the second transition metal oxide layer 104 (FIG. 2D).

In a case in which the first transition metal layer is formed of titanium, amorphous titanium oxide can be obtained by performing the plasma oxidation in the step (a) at a film forming temperature of 250 degrees C. or higher but equal to or lower than 400 degrees C. By forming the amorphous titanium oxide, as described above, the surface of the interface between the first transition metal oxide layer 103 and the second transition metal oxide layer 104 and the surface of the interface between the first transition metal oxide layer 103 and the first electrode 101 become flat. As a result, variation of the variable resistance path can be reduced among the elements in comparison with a case in which the transition metal oxide layer is formed of a polycrystalline material.

EXAMPLE

In order to explain this exemplary embodiment mentioned above in more detail, an example of this exemplary embodiment will be described in detail below with reference to the drawing.

Example 1

This example 1 will be explained in detail based on the experiment using sample elements 1 to 3.

[Explanation of manufacturing method] A method for manufacturing the sample elements 1 to 3 will be described. A lower electrode having the laminated structure composed of a tantalum nitride layer having a film thickness of 5 nm and a ruthenium layer having a film thickness of 5 nm is formed on a semiconductor (single crystal silicon) substrate. This method is applied to all the sample elements 1 to 3. The lower electrode is formed by continuously forming the film at a temperature of 300 degrees C. by a DC sputtering device.

Next, a titanium layer having a film thickness of 2 nm is formed on the lower electrode. This method is applied to all the sample elements 1 to 3. The titanium layer is formed by depositing a film by the DC sputtering device in which titanium is used as a sputtering target. At this time, argon gas is supplied in a chamber in which the titanium layer is formed at a flow rate of 50 sccm, a film forming temperature is set to 300 degrees C., and a DC power is set to 0.2 kW.

Next, by exposing the titanium layer to the oxygen plasma atmosphere, the titanium layer is oxidized to form the titanium oxide layer. At the time of oxidation, oxygen gas is supplied in the chamber in which the plasma oxidation is performed at the flow rate of 2800 sccm, and exhaust is adjusted so that the pressure is 150 Pa. Further, at the time of oxidation, the film forming temperature is set to 250 degrees C. and an RF power is set to 2.0 kW. When titanium having the film thickness of 2 nm is formed, a plasma oxidation time required to form titanium oxide (TiO2) having a stoichiometric composition is about 300 seconds.

The plasma oxidation times for the sample elements 1, 2 and 3 are set to 60 seconds, 300 seconds, and 600 seconds, respectively. Further, "sccm" is a unit of a flow rate and it means that 1 cm3 of fluid flows in one minute at a temperature of 0 degrees C. and 1 atmospheric pressure.

As a result of the oxidation, in the sample element 1, titanium oxide is formed on the ruthenium layer of which the lower electrode is formed. In the sample elements 2 and 3, titanium oxide is formed on the ruthenium layer of which the lower electrode is formed and the ruthenium oxide layer is formed on the surface of the ruthenium layer.

Next, in the sample elements 1 to 3, the tantalum oxide layer having the film thickness of 15 nm is formed on the titanium oxide layer. The tantalum oxide layer is formed by depositing a film by an RF sputtering device in which tantalum oxide is used as a sputtering target. Oxygen gas and argon gas are supplied in the chamber at the flow rate of 5 sccm and 40 sccm, respectively, the film forming temperature is set to 350 degrees C., and a power is set to 2 kW.

Next, the upper electrode composed of the platinum layer having the film thickness of 40 nm is formed on the tantalum oxide layer. The upper electrode is formed by using an electron beam heating method. At this time, the deposition is performed at a deposition rate of 0.2 nm/sec so as not to give damage to the transition metal oxide layer. This upper electrode is used for all the sample elements 1 to 3.

A layer structure of the sample elements 1 to 3 is shown in table 1.

TABLE 1

| | lower Ru electrode | Ti film thickness | plasma oxidation time | TaO film thickness | upper Pt electrode |
|---|---|---|---|---|---|
| sample element 1 | 5 nm | 2 nm | 60 sec | 15 nm | 40 nm |
| sample element 2 | 5 nm | 2 nm | 300 sec | 15 nm | 40 nm |
| sample element 3 | 5 nm | 2 nm | 600 sec | 15 nm | 40 nm |

[Evaluation of composition] A composition of ruthenium oxide formed in the sample elements 1 to 3 is evaluated by an XPS (X-ray photoelectron spectroscopy). A Al (Kα ray) is used as an X ray source.

Figure 3:
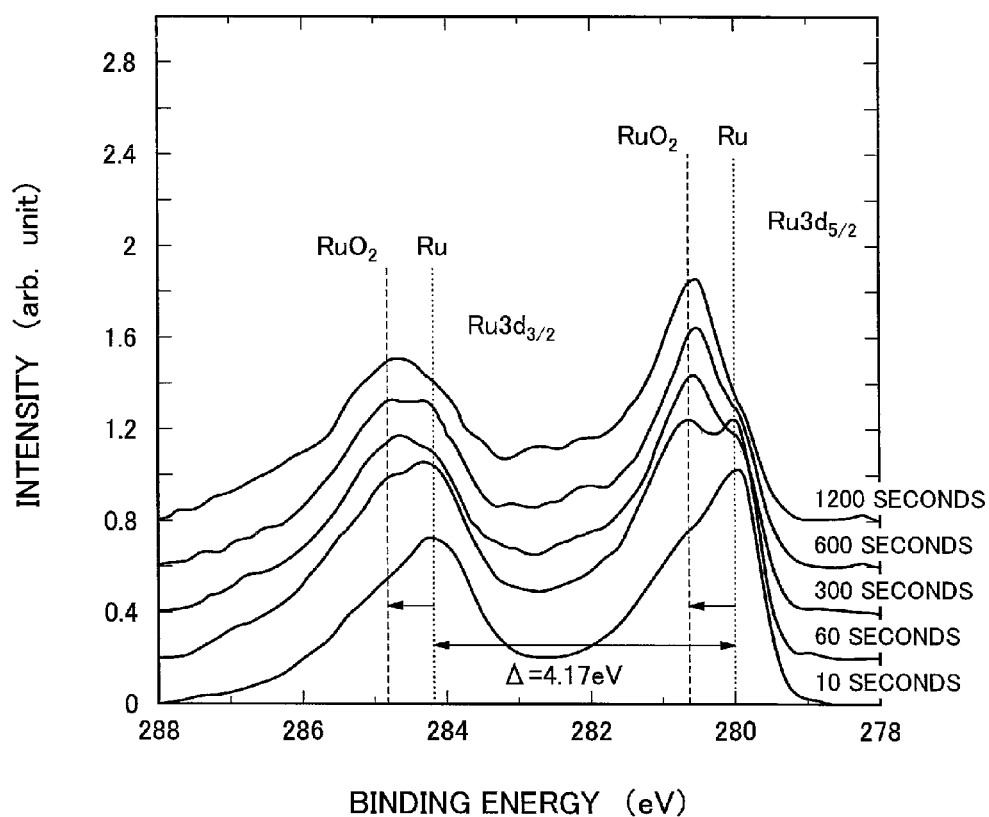
FIG. 3 is a figure showing an example of a composition of an electrode according to an exemplary embodiment of the present invention.

An XPS spectrum of an Ru3d (278 to 288 eV) orbit is shown in FIG. 3. As shown in FIG. 3, while Ru4+3d3/2 peak and Ru4+3d5/2 peak that are derived from a metal are observed in an Ru3d region when the plasma oxidation time is 10 seconds, the intensity of Ru4+3d3/2 peak and the intensity of Ru4+3d5/2 peak that are derived from ruthenium oxide are very small.

On the other hand, Ru4+3d3/2 peak and Ru4+3d5/2 peak having strong intensity that are derived from ruthenium oxide are observed in the Ru3d region when the plasma oxidation time is set to a standard condition of 300 seconds or more. However, the intensity of Ru4+3d3/2 peak and the intensity of Ru4+3d5/2 peak that are derived from metallic ruthenium are extremely small.

As described above, it is understood that because the absolute value of the free energy of oxidation of ruthenium is sufficiently small in comparison with the absolute value of the free energy of oxidation of titanium, the oxidation of ruthenium does not occur until the titanium layer is completely oxidized.

From this result, it is understood that the titanium oxide layer having a large oxygen concentration gradient is formed on the ruthenium lower electrode in the sample element 1 to which a short plasma oxidation time is applied. On the other hand, it is understood that the ruthenium oxide layer and the titanium oxide layer having a small oxygen concentration gradient are sequentially formed on the ruthenium lower electrode in the sample elements 2 and 3 to which a long plasma oxidation time is applied.

Next, the composition of the titanium oxide layer formed in the sample elements 1 to 3 is evaluated by the XPS. The Al (Kα ray) is used as the X ray source.

FIG. 4 shows the XPS spectrum of a Ti2p (455 to 470 eV) orbit and an O1s (525 to 540 eV) orbit.

Figure 4B:
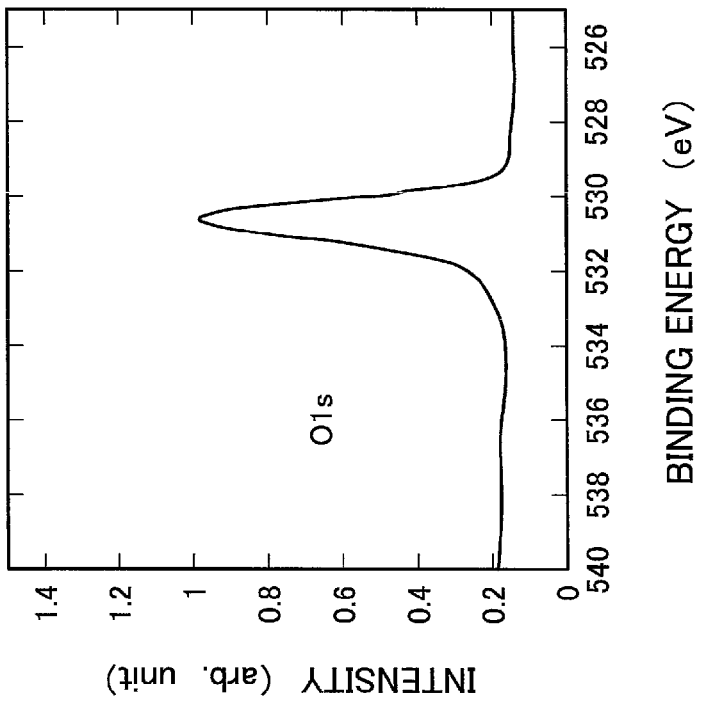
FIG. 4 is a figure showing a composition of a titanium oxide layer according to an example 1 of the present invention.
Figure 4A:
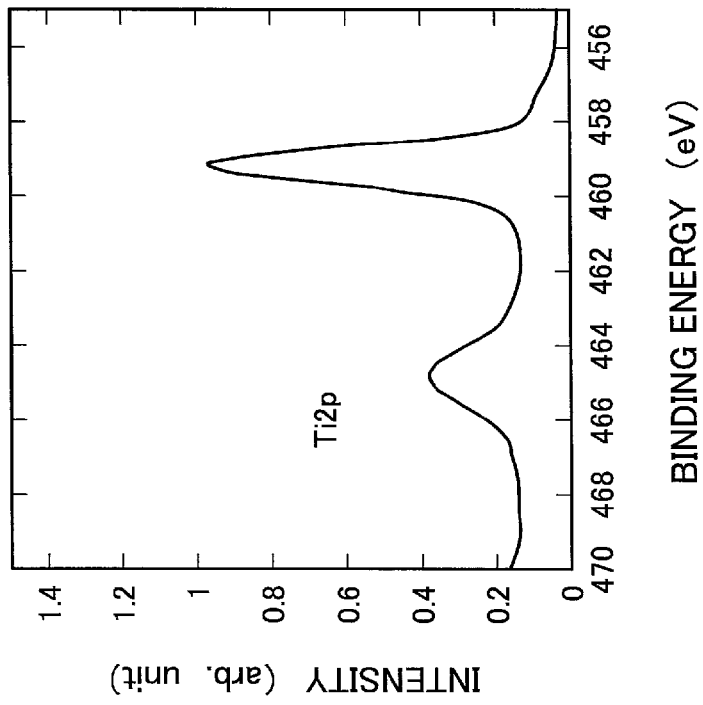

FIG. 4(a) shows the spectrum of the Ti2p orbit of the sample elements 1 to 3. FIG. 4(b) shows the spectrum of the O1s orbit of the sample elements 1 to 3.

It is understood that a composition ratio (O/Ti) of titanium oxide that is obtained from an area of the spectrum of the Ti2p orbit and an area of the spectrum of the O1s orbit shown in FIG. 4 is almost 2 and titanium oxide (TiO2) having a stoichiometric composition is formed on the surface of the titanium oxide layer.

On the other hand, in the sample elements 1 to 3, because the plasma oxidation method of titanium is used to form the titanium oxide layer, the oxygen concentration gradient is formed at the inside of the titanium oxide layer.

Figure 5:
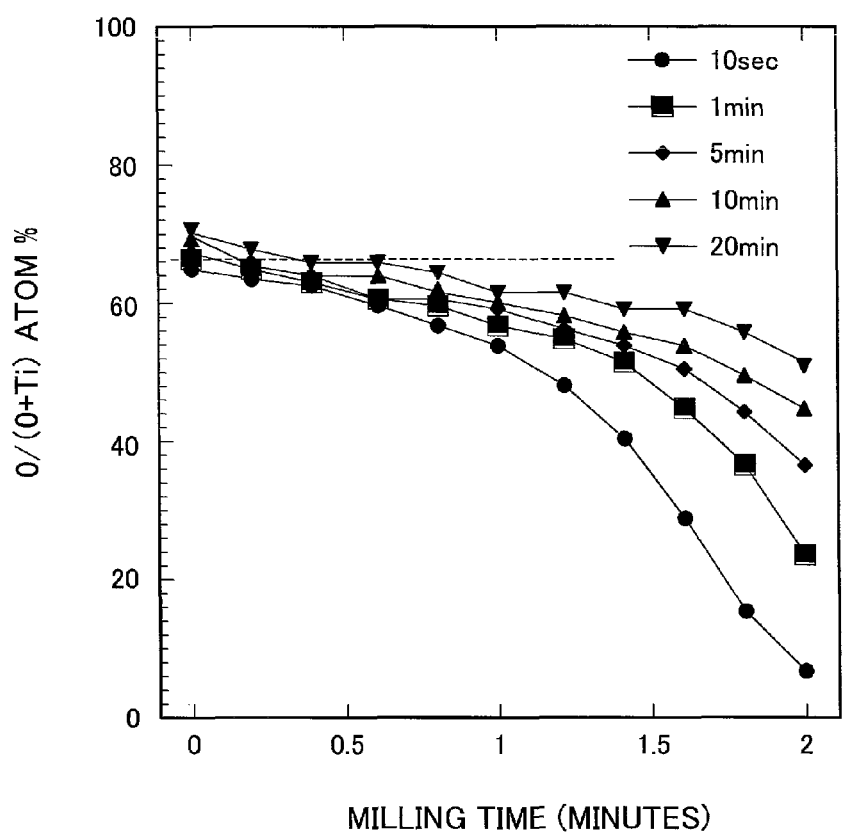
FIG. 5 is a figure showing an oxygen concentration of a titanium oxide layer according to an example 1 of the present invention.

FIG. 5 shows a result of a comparison of the oxygen concentration expected from a ratio of the areas of the XPS spectrums of the Ti2p orbit and the O1s orbit.

In FIG. 5, the horizontal axis is a milling time and it corresponds to a depth from the surface of the titanium oxide layer.

FIG. 5 shows measurement results for two sample elements that are oxidized by the plasma oxidation for 10 seconds and 1200 seconds, respectively.

From FIG. 5, it is understood that the oxygen concentration is a stoichiometric composition at the surface of the titanium oxide layer and decreases in a direction toward the ruthenium lower electrode. Further, it is understood that the shorter the oxidation time is, the more the oxygen concentration of the sample element decreases from the stoichiometric composition.

Further, it is shown in non-patent document 2 that when the plasma oxidation of titanium is performed at 400 degrees C., the amorphous titanium oxide is obtained. It is recognized that the amorphous titanium oxide is crystallized by an annealing process at 600 degrees C. or more. The annealing process at 600 degrees C. or more is not performed for the sample elements 1 to 3. Accordingly, we can say that the titanium oxide layer is amorphous in the sample elements 1 to 3. Even when the variable resistance element of this example is mounted on a wiring layer of an integrated circuit, a process for manufacturing the wiring layer is performed at a temperature of 600 degrees C. or less. The inventors of the present invention confirmed that the state of the titanium oxide layer is kept amorphous from a diffraction image by a cross-sectional TEM analysis.

[non-patent document 2] G. He et al., Chemical PhysicsLetters, Vol. 395, pp. 259, 2004

Next, a result of an evaluation in which the composition of tantalum oxide formed in the sample elements 1 to 3 is evaluated by the XPS will be described. The Al (Kα ray) is used as the X ray source.

Figure 6A:
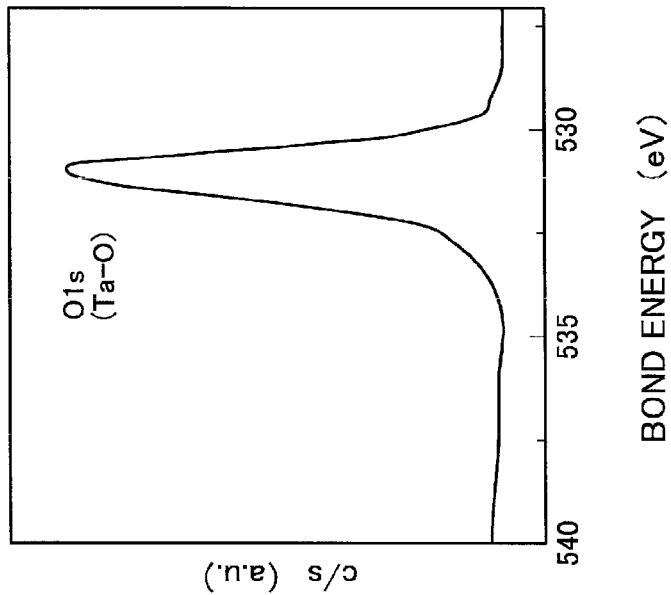
FIG. 6 is a figure showing a composition of a tantalum oxide layer according to an example 1 of the present invention.
Figure 6B:
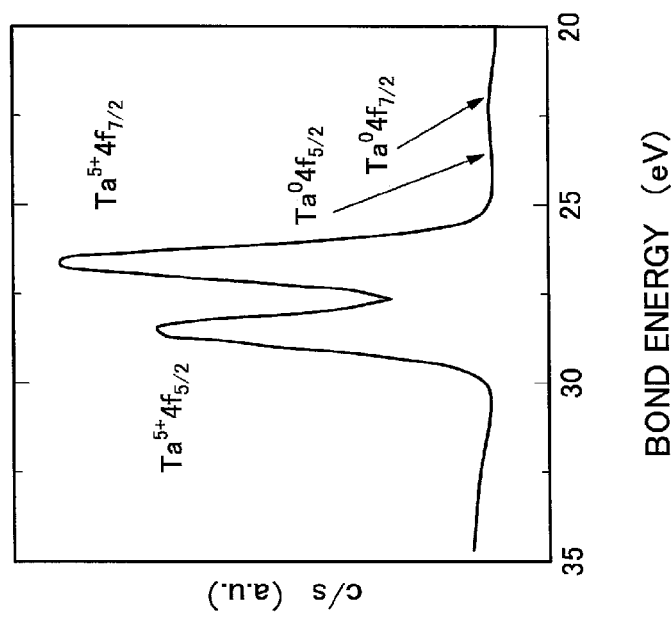

FIG. 6(a) shows the XPS spectrum of a Ta4f (25 to 35 eV) orbit and FIG. 6(b) shows the XPS spectrum of an O1s (525 to 545 eV) orbit. As shown in FIG. 6, a Ta5+4f5/2 peak and a Ta5+4f7/2 peak that are derived from tantalum oxide and a Ta04f5/2 peak and a Ta04f7/2 peak having a weak intensity that are derived from metallic tantalum are observed in a Ta4f region. Further, the peak derived from the Ta—O bond is observed in an O1s region. The composition ratio of tantalum oxide (O/Ta) that is obtained from the spectrum areas of these is approximately 2.5. Accordingly, it is understood that tantalum oxide (Ta2O5) having the stoichiometric composition is formed.

Next, the crystallinity and the crystallization temperature of the tantalum oxide layer are examined by the XRD (X-ray diffraction). The tantalum oxide layer is formed on a silicon by the above-mentioned sputtering method and after that, the samples are produced by performing the high temperature annealing process at 500, 600, 700, and 800 degrees C. in the oxygen atmosphere.

Figure 7:
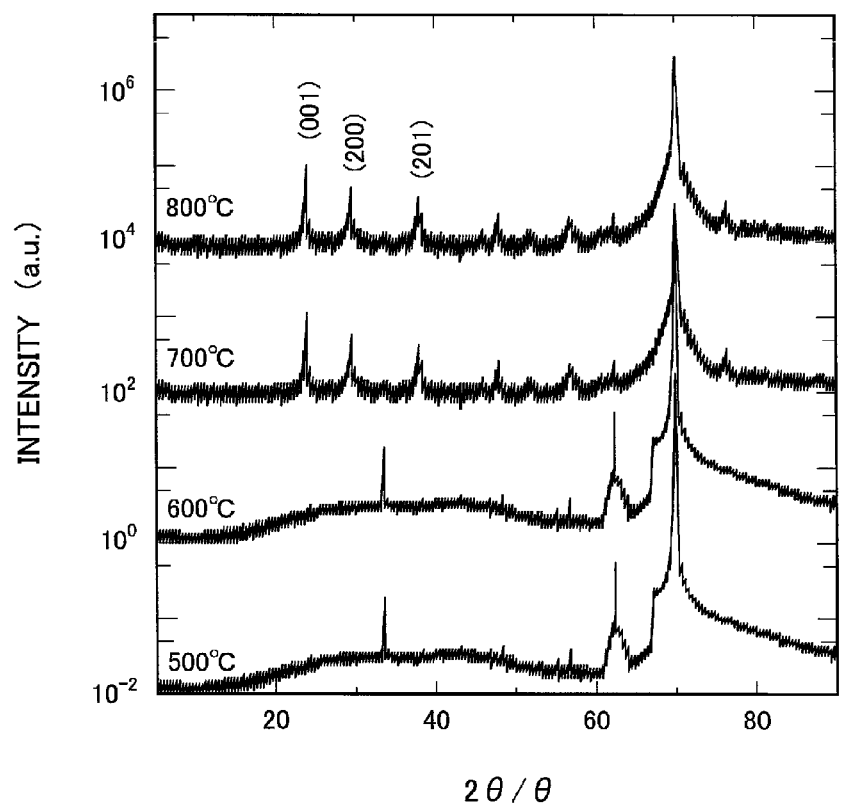
FIG. 7 is a figure showing a crystalline state of a tantalum oxide layer according to an example 1 of the present invention.

FIG. 7 shows the XRD spectrum of each sample. From FIG. 7, it can be confirmed that tantalum oxide is crystallized at 700 degrees C. or more and a (001) surface, a (200) surface, and a (201) surface are formed. Further, the peak observed at a temperature lower than 700 degrees C. is derived from silicon of the substrate. Here, the annealing process is not performed at 700 degrees C. or more for the above-mentioned sample elements 1 to 3. Accordingly, we can say that the tantalum oxide layer is amorphous. Even when the variable resistance element of this example is mounted on a wiring layer of an integrated circuit, a temperature of the process for manufacturing the wiring layer is 600 degrees C. or less. Therefore, the state of the titanium oxide layer is kept amorphous.

[Variable resistance characteristic] Next, the variable resistance characteristic of the sample element 2 will be described. In the sample element 2, the variable resistance layer has the laminated structure composed of an amorphous titanium oxide layer and an amorphous tantalum oxide layer. In the sample element 2, the oxygen concentration in the amorphous titanium oxide layer decreases in a direction toward the lower electrode side from the interface between the amorphous titanium oxide layer and the amorphous tantalum oxide layer. The upper electrode has a planar shape whose size is 50 nm square.

Because the sample element 2 in an initial state in which the film has just been formed is an insulating body, a Forming operation is performed to form a current path in the oxide film by applying a pulse voltage. After that, by applying a voltage to the sample element 2, data writing of a high resistance state (reset state) '0' and a low resistance state (set state) '1' is performed.

In this case, the writing of 0→1 is called a set operation and the writing of 1→0 is called a reset operation. A voltage in the set operation is called a set voltage and a resistance in the set state is called a set resistance. Similarly, a voltage in the reset operation is called a reset voltage and a resistance in the reset state is called a reset resistance.

Figure 8:
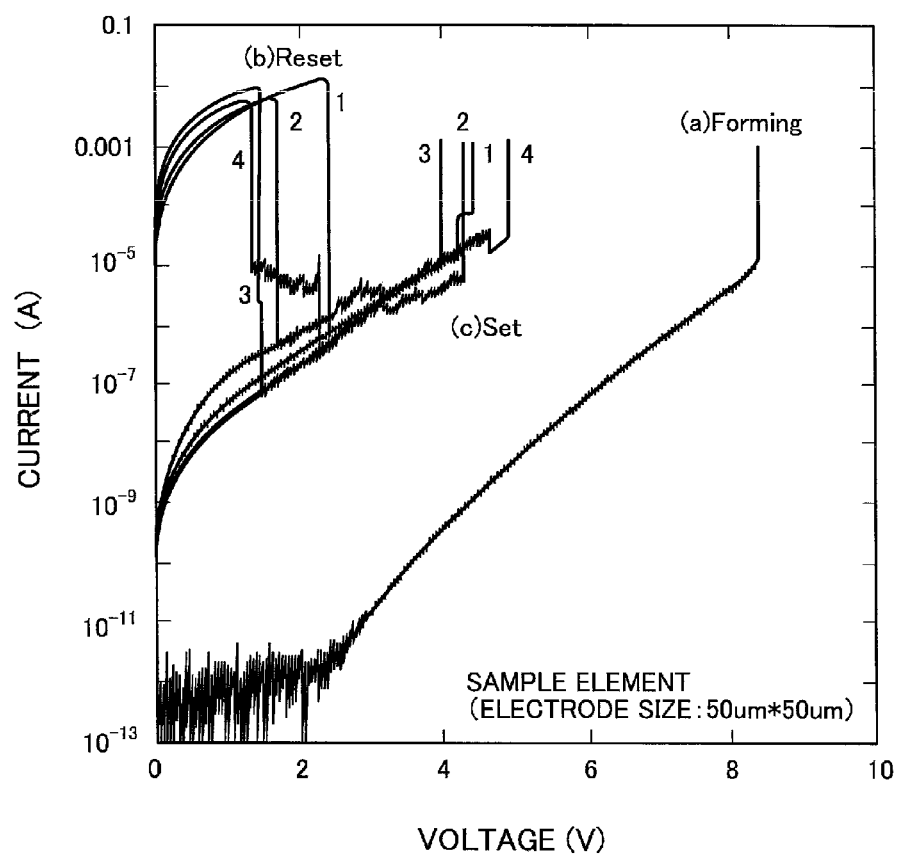
FIG. 8 is a figure showing a variable resistance characteristic of an example 1 of the present invention.

FIG. 8(a) shows a state of the resistance change (formation of the variable resistance path) by the Forming The electric current sharply increases when the applied voltage is around 8 V and at this time the variable resistance path is formed. FIG. 8(b) shows a state of the resistance change when a positive bias is applied to the upper electrode after the Forming is performed. FIG. 8(c) shows a state of the resistance change when the positive bias is applied to the upper electrode after the resistance has been changed to the high resistance. The number shown in the figure indicates the order of the voltage sweep.

Further, a variable resistance mechanism of a lamination type variable resistance element represented by the sample element 2 will be described. A state before the variable resistance path is formed (in a range between 0 to 2 volts) shown in FIG. 8(a) indicates an initial leak current characteristic of the variable resistance layer. From the analysis of the current-voltage characteristic, it is known that the rate of the initial leak current is controlled in the tantalum oxide layer and a conduction mechanism of it is of a Poole-Frenkel type (PF type) (non-patent document 3).

On the other hand, after the Forming is performed, a path having a different conduction mechanism is generated in parallel. The resistance of this path is very small compared to the resistance of the path having the PF type conduction mechanism. Accordingly, most of the electric current that flows between the electrodes flows through this path.

Here, it is usually understood that the variable resistance path formed by the Forming is equivalent to a breakdown path formed when a breakdown voltage is applied to an insulating body. The breakdown path is investigated in detail by using silicon oxide used for the gate insulating film or the like. In a study using silicon oxide, it is known that the oxygen defect is formed in the path and the leak current path is generated by this (non-patent document 4).

Based on the estimation from this, it is estimated that the variable resistance path of the tantalum oxide layer formed after the Forming is performed is Ta2O5-X in which oxygen is removed from tantalum oxide (Ta2O5) having the stoichiometric composition.

[non-patent document 3] E. Atanassova, et al., Microelectronics Reliability, Vol. 42, pp. 157, 2002

[non-patent document 4] X. Li et al., APL, Vol. 93, pp. 072903, 2008

As shown in FIG. 8(b), the state of the sample element 2 to which the Forming has been performed is changed from a low resistance state to a high resistance state by applying the positive bias to the upper electrode. The high resistance state occurs with good reproducibility when the applied voltage is around 2 volts and the low resistance state is stable when the applied voltage is in a range between 0 volt and about 2 volts.

Further, as shown in FIG. 8(c), the state of the sample element 2 in the high resistance state is changed from the high resistance state to the low resistance state by applying the positive bias to the upper electrode. The low resistance state occurs with good reproducibility when the applied voltage is around 4 volts and the high resistance state is stable when the applied voltage is in a range between 0 volt and about 4 volts.

It is understood that the resistance change to the high resistance state or the low resistance state is caused by movement of an oxygen ion (O—) in the variable resistance path. Namely, in the sample elements 1 to 3, it is understood that the resistance change is caused by the change in the oxygen ion density at the interface between the titanium oxide layer and the tantalum oxide layer or a tantalum oxide region adjacent to the titanium oxide layer.

A mechanism of the resistance change caused by the movement of the oxygen ion will be described in detail by using the sample element 2 as an example with reference to an energy band diagram (band diagram).

FIG. 9A schematically shows a structure and a band diagram of the sample element 2 before the Forming is performed. In a band diagram 905 a band diagram 906, a vertical axis is energy E and a horizontal axis is along a film thickness direction (Z) and a direction (X) perpendicular to the direction. The band diagram 905 and the band diagram 906 correspond to a region shown by the broken line indicated in FIG. 9A. An electron can not exist in an energy region filled with gray in the diagram and the region is called an energy gap. In the band diagram 905, a symbol EC represents a lowermost end of a conduction band, a symbol EV represents an uppermost end of the valence band, and a symbol EF represents Fermi Energy Level of the electrode.

A second layer 904 shown in FIG. 9A is formed of amorphous tantalum oxide having the stoichiometric composition and includes the oxygen defect. Although the energy gap of Ta2O5 is about 4.5 eV and an insulating body, it is understood that the defect level caused by the oxygen defect exists in the energy gap. The PF type electron conduction occurs via this defect level.

A first layer 903 shown in FIG. 9A is formed of amorphous titanium oxide and it is understood from a result of the XPS that titanium oxide on the tantalum oxide layer side has the stoichiometric composition. As described above, the percentage of oxygen continuously decreases in a direction toward a first electrode 901.

FIG. 9B schematically shows a structure and a band diagram of the sample element 2 after the Forming has been performed. In the band diagram 905 and the band diagram 906, the vertical axis is energy E and the horizontal axis is along a film thickness direction (Z) and a direction (X) perpendicular to the direction. The band diagram 905 and the band diagram 906 correspond to a region shown by the broken line indicated in FIG. 9B.

As described above, it is understood that the breakdown path caused by the oxygen defect is formed in the variable resistance layer after the Forming has been performed. A state in which the breakdown path is formed is indicated by circles. It is understood that when many oxygen defects occur, an energy band structure of tantalum oxide largely changes from the band structure of tantalum oxide (Ta2O5) having the stoichiometric composition. Therefore, usually, the energy gap becomes small. As a result, the resistance value of this breakdown path decreases. Therefore, the resistance value of the variable resistance layer largely decreases. This corresponds to the low resistance state of the variable resistance element of this example.

FIG. 9C schematically shows a structure and a band diagram of the sample element 2 in the high resistance state. In the band diagram 905 and the band diagram 906, the vertical axis is energy E and the horizontal axis is along a film thickness direction (Z) and a direction (X) perpendicular to the direction. The band diagram 905 and the band diagram 906 correspond to a region shown by the broken line indicated in FIG. 9C.

As described above, it is understood that the high resistance state occurs by the segregation of the oxygen ion at the interface between the titanium oxide layer and the tantalum oxide layer or in the tantalum oxide region adjacent to the titanium oxide layer. As a result, the large energy gap occurs in a band of the interface and this is a mechanism by which the high resistance state occurs.

As described above, the inventors of the present invention have found out that the low resistance state occurs when the oxygen defect occurs at the interface between the titanium oxide layer and the tantalum oxide layer or in the tantalum oxide region adjacent to the titanium oxide layer. Further, the inventors of the present invention have found out that the high resistance state occurs when the segregation of the oxygen ion occurs at the interface between the titanium oxide layer and the tantalum oxide layer or in the tantalum oxide region adjacent to the titanium oxide layer.

Because the transition metal oxide layer formed of the first transition metal and the transition metal oxide layer formed of the second transition metal are in contact with each other, the gap occurs between the energy bands and whereby, the oxygen defect and the segregation of the oxygen ion occur. This makes the resistance change stable.

In contrast, in a case described in non-patent document 1 in which the transition metal oxide layer and the electrode layer are in contact with each other, because the oxygen that gathers near the interface between the electrode layer and the transition metal oxide layer diffuses into the electrode layer, the oxygen defect and the segregation of the oxygen ion insufficiently occurs. Accordingly, the unstable resistance change occurs.

Figure 10:
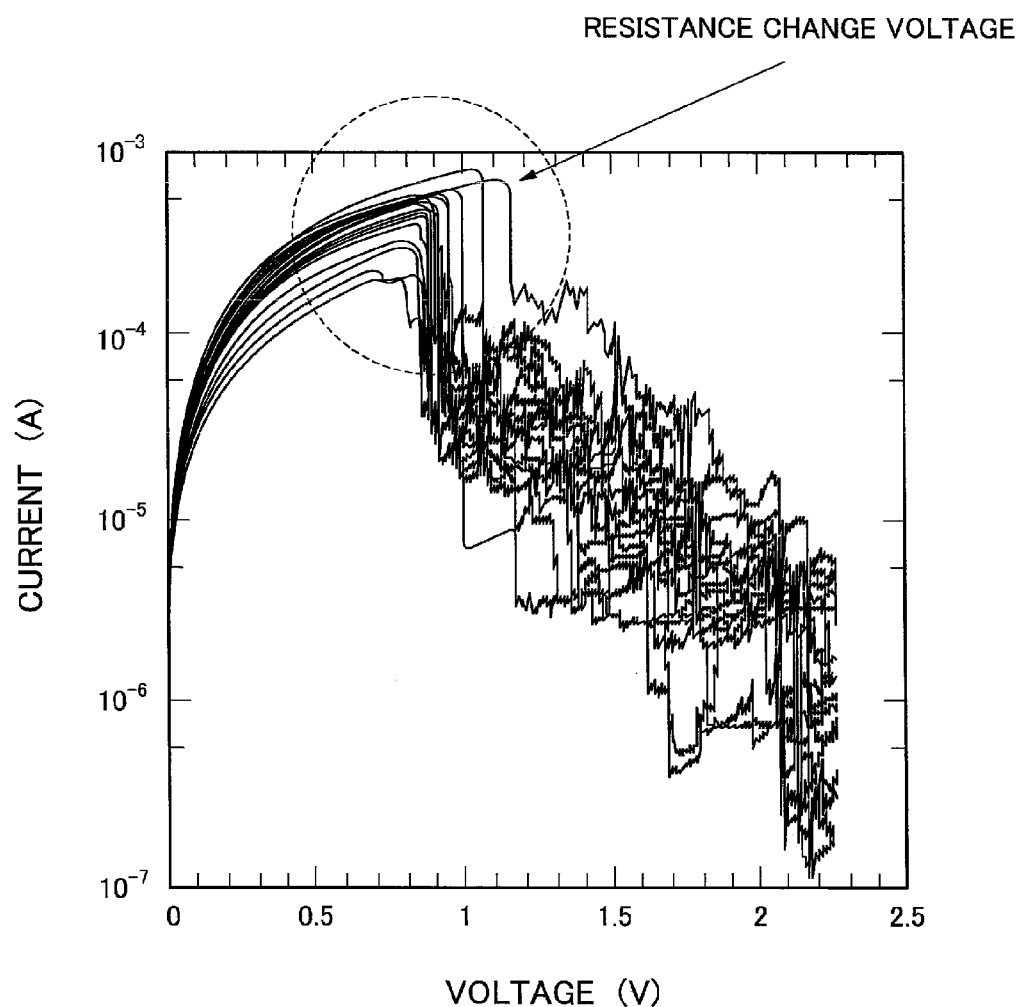
FIG. 10 is a figure showing a variable resistance characteristic in an example 1 of the present invention.

FIG. 10 shows a state in which a sweep reset operation of a single element is repeated 20 times. The electric current greatly decreases when the applied voltage is about 1 volt. It is considered that this phenomenon occurs when the applied voltage exceeds a certain threshold voltage that is materialspecific. Further, the resistance increases with increase of the voltage. Even if a pulse voltage is applied, the same behavior is observed.

Figure 11:
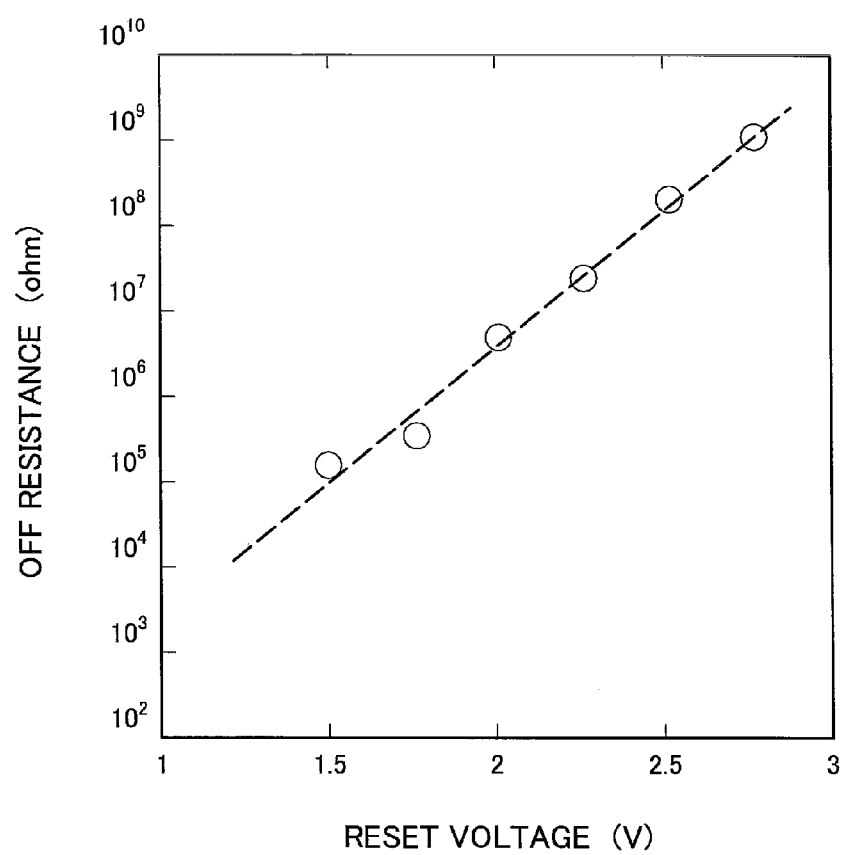
FIG. 11 is a figure showing a variable resistance characteristic in an example 1 of the present invention.

FIG. 11 is a graph showing resistance of the element plotted against the reset voltage for a voltage of 1.5 volts, 1.75 volts, 2.0 volts, 2.25 volts, and 2.5 volts. In FIG. 11, a center value of 20 times measurement is plotted. It is understood that the resistance exponentially increases with increase of the reset voltage. This corresponds to the increase in an amount of the segregation or a width of the segregation of the oxygen ion to the interface between the titanium oxide layer and the tantalum oxide layer.

FIG. 9D schematically shows a structure and a band diagram of the sample element 2 in the low resistance state. In the band diagram 905 and the band diagram 906, the vertical axis is energy E, and the horizontal axis is along a film thickness direction (Z) and a direction (X) perpendicular to the direction. The band diagram 905 and the band diagram 906 correspond to a region shown by the broken line indicated in FIG. 9D.

A case in which a positive voltage is applied to the second electrode of the element in the high resistance state after the reset operation has been performed will be considered. In this case, the resistance of the breakdown path is negligible small compared to the resistance in the high resistance region. Therefore, the breakdown path can be regarded as a part of the second electrode. Accordingly, it is understood that when the voltage is applied between the first electrode and the second electrode, most of the voltage drop occurs in the high resistance region located at the edge of the breakdown path that is represented by the reference number 903 in FIG. 9 (D) and in other words, it occurs in a tunnel bather region caused by the oxygen segregation.

Figure 12:
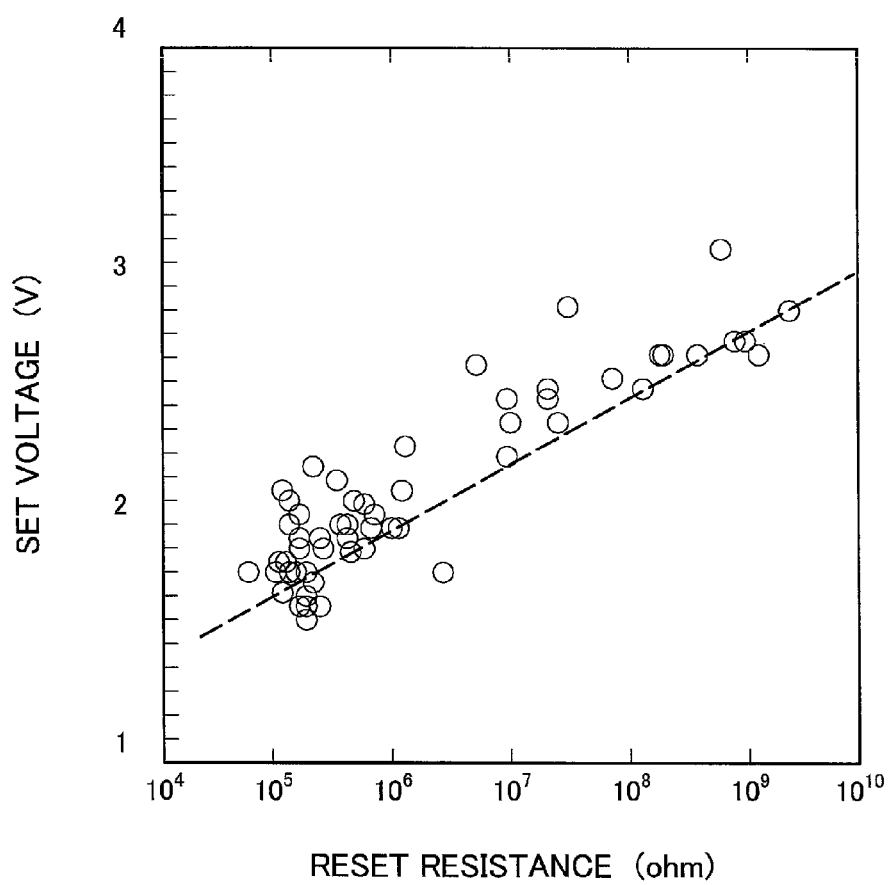
FIG. 12 is a figure showing a variable resistance characteristic in an example 1 of the present invention.

FIG. 12 shows a correlation between the reset resistance and the set voltage. When the reset voltage is plotted on a logarithmic scale, the reset resistance and the set voltage have a positive correlation. As described above, this behavior can be easily understood when it is understood that the high resistance region is the tunnel barrier. With respect the electrical conduction through the tunnel barrier, it is known that the resistance roughly exponentially increases with the increase in the width thereof. Accordingly, the reset voltage that is plotted on a logarithmic scale can be read by the width plotted on a linear scale. When an internal electrical field in this region reaches a breakdown electrical field, the high resistance region breaks down and the state returns to the low resistance state again as well as the case of the Forming operation mentioned above. This is the "return to low resistance state" phenomenon shown in FIG. 8(c). Further, similarly, a reverse bias can be applied to return to the low resistance state.

Next, the variable resistance characteristic (the state is changed to the high resistance state) of the sample elements 1 to 3 in which an angle of the oxygen concentration gradient in the titanium oxide layer is changed by changing the plasma oxidation time of the titanium layer will be described. Further, the upper electrode has a planar shape whose size is 2 μm square.

Figure 13:
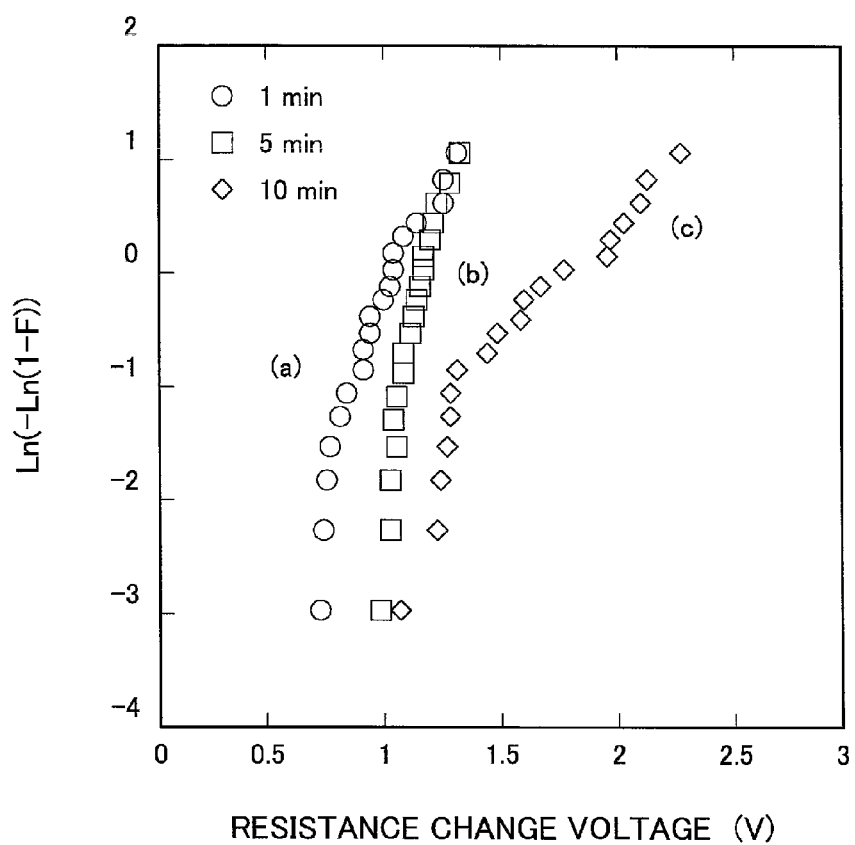
FIG. 13 is a figure showing a variable resistance characteristic in an example 1 of the present invention.

In a graph shown in FIG. 13, the variable resistance characteristic (the state is changed to the high resistance state) is measured on 20 elements for each sample element, a resistance change voltage is extracted, and it is plotted on the Weibull probability paper. FIG. 13(a) shows a measurement result of the sample element 1. In this case, the angle of the oxygen concentration gradient is maximum. In contrast, FIG. 13(c) shows a measurement result of the sample element 3. In this case, the angle of the oxygen concentration gradient is minimum. FIG. 13(b) shows a measurement result of the sample element 2. In this case, the angle of the oxygen concentration gradient is greater than that of the sample element 3 and smaller than that of the sample element 1.

According to FIG. 13(a) to FIG. 13(c), it is understood that the lager an angle of the oxygen concentration gradient is, the smaller the resistance change voltage of the sample element is. It is understood that the reason for this is that the smaller the oxygen concentration is, the more a diffusion coefficient of the oxygen ion or the oxygen defect in the titanium oxide layer increases. Accordingly, the electric current required when the state is changed to the high resistance state is small if a set resistance is set to a large value in advance. As a result, the electric power (power consumption) required for the switching operation can be reduced.

Figure 14:
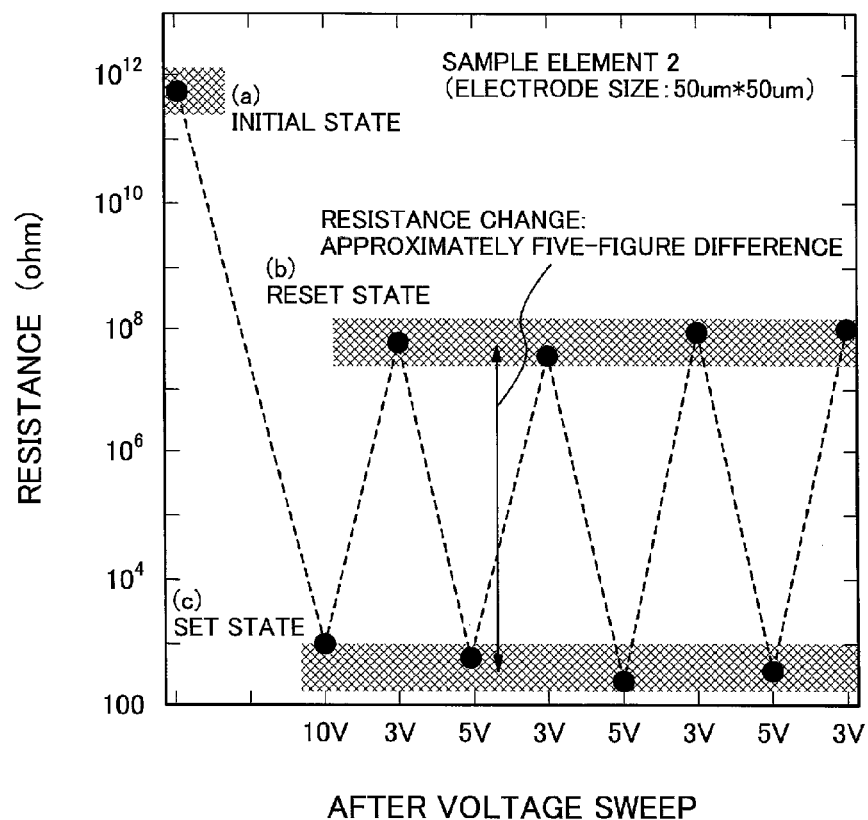
FIG. 14 is a figure showing a variable resistance characteristic in an example 1 of the present invention.

FIG. 14 shows a change in the resistance value when the sample element 2 performs the resistance change operation and 0.2 volts is applied. The size of the upper electrode is 50 μm square. As shown in FIG. 14(a), the resistance value in the initial state is about $1 \times 10^{12}$ ohms As shown in FIG. 14(b), the resistance value in the high resistance state (reset state) is about $1 \times 10^{8}$ ohms As shown in FIG. 14(c), the resistance value in the low resistance state (set state) is about $1 \times 10^{3}$ ohms.

As described above, there is approximately five-figure difference between the resistance in the low resistance state and the resistance in the high resistance state. Therefore, the large resistance change is achieved in the resistance change operation. As shown in FIG. 14, the resistance is changed with good reproducibility. As described above, it is understood that the reason for this is that because the titanium oxide layer and tantalum oxide are in contact with each other, the generation of the oxygen defect and the segregation of the oxygen ion occur at the interface between them.

Figure 15:
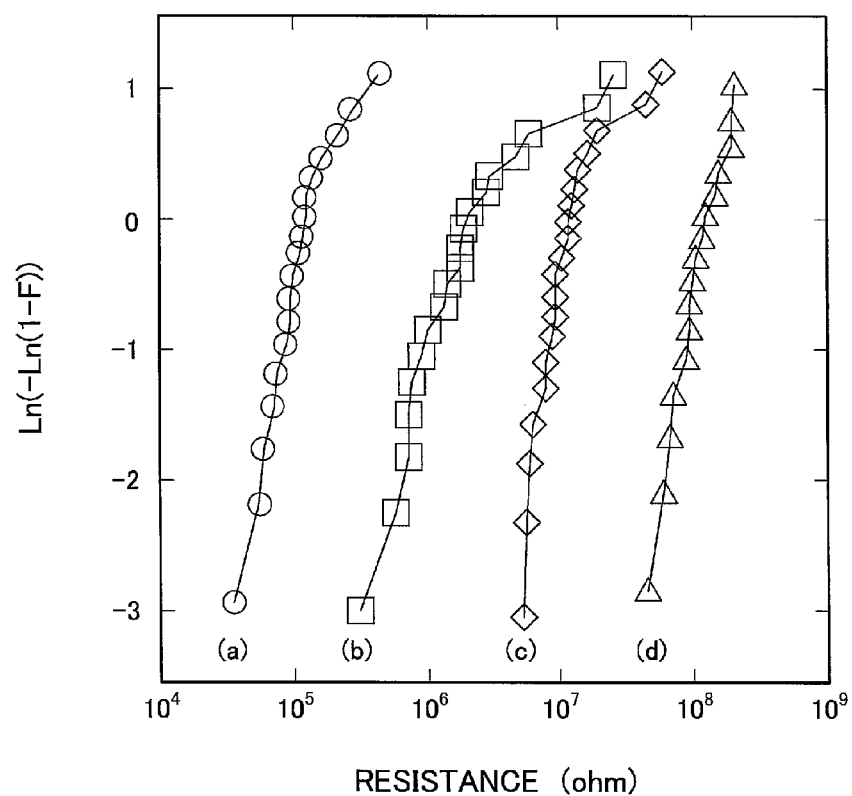
FIG. 15 is a figure showing a variable resistance characteristic in an example 1 of the present invention.

The resistance value in the high resistance state can be controlled by changing an amplitude of a sweep voltage or a pulse voltage. FIG. 15 shows an example of a case of the sample element 2. The data is measured four times (a) to (d) by changing the amplitude of the pulse voltage. Multiple values which have about one-figure difference in the resistance value can be realized by changing the amplitude of the pulse voltage.

As described above, in this example, the oxygen concentration gradient of the titanium oxide layer used for the variable resistance layer is utilized, the starting point of the gradient is set to the interface between the titanium oxide layer and the tantalum oxide layer, and whereby, the voltage required to change the resistance can be reduced and the stable variable resistance characteristic can be obtained. Additionally, by making the angle of the oxygen concentration gradient large, the voltage required to change the resistance can be further reduced and also the electric current which flows in the operation can be suppressed.

Furthermore, in this example, by using the amorphous variable resistance layer in the variable resistance element, the sufficiently flat surface can be formed between the variable resistance layer and the electrode layer and whereby, the variation of the variable resistance path can be reduced among the elements. This is useful for realizing miniaturization (high integration) of the element. It is shown that even if the ruthenium oxide layer is formed between the titanium lower electrode and the titanium oxide layer, it does not affect the resistance change operation greatly.

Example 2

Next, as an application example of the variable resistance element in the example 2, a case in which the variable resistance element in this example is applied to a storage device will be described.

Figure 16:
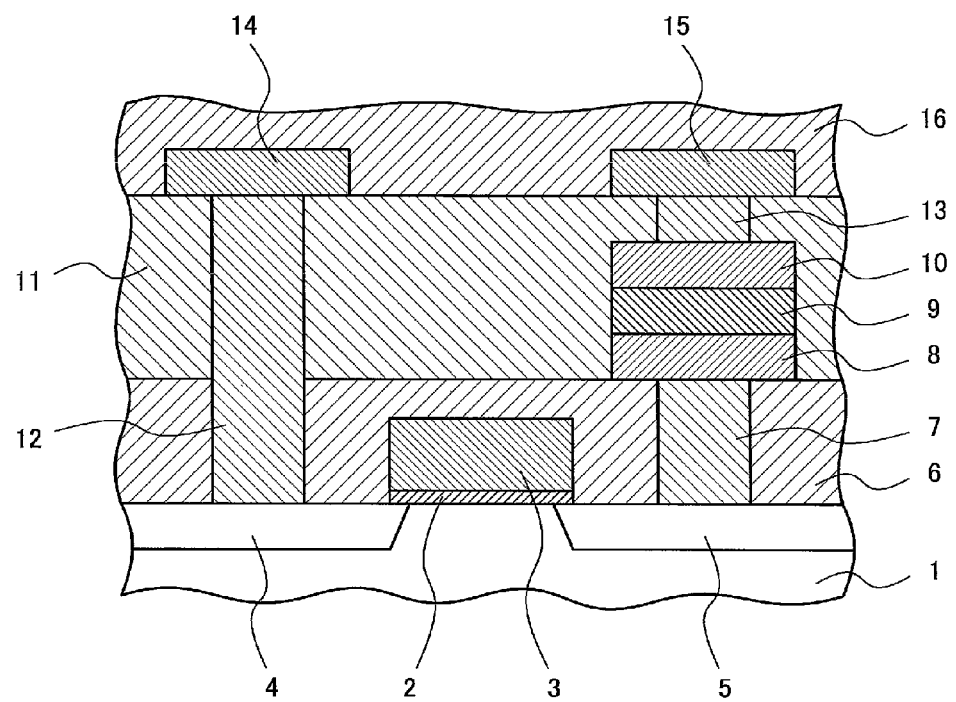
FIG. 16 is a figure showing an example of a method for manufacturing a semiconductor device according to an example 2 of the present invention.

As shown in a cross-sectional view of FIG. 16, this storage device includes a MOS transistor in which for example, a gate insulating film 2, a gate electrode 3, a source 4, and a drain 5 are formed on a semiconductor substrate 1 formed of a single crystal silicon. This MOS transistor is used as the control transistor.

The variable resistance element in this example that is composed of a lower electrode 8, a variable resistance layer 9, and an upper electrode 10 is formed on an interlayer insulation film 6 formed on the gate electrode 3. The variable resistance layer 9 has the laminated structure composed of for example, the titanium oxide layer and the amorphous tantalum oxide layer. The lower electrode 8 is connected to the drain 5 by a contact via 7 formed in a contact hole of the interlayer insulation film 6.

Further, an interlayer insulation film 11 is formed on the variable resistance element mentioned above. A wiring 14 used as a bit line and a wiring 15 that is grounded are formed on the interlayer insulation film 11. The wiring 14 is connected to a contact via 12 that is in contact with the source 4 by penetrating through an interlayer insulation film 11 and the interlayer insulation film 6. The wiring 15 is connected to the upper electrode 10 by a via 13 formed in the via hole of the interlayer insulation film 11. Further, the gate electrode 3 is connected to a word line.

Further, the control transistor mentioned above is for example, an N type field effect transistor (NFET) or a P type field effect transistor (PNET). The gate insulating film 2 is formed of for example, silicon oxide and it is formed by thermally oxidizing the surface of the semiconductor substrate 1 formed of single crystal silicon. The gate insulating film 2 may be formed of hafnium oxide, zirconium oxide, aluminum oxide, an oxide of these, silicate, or nitride. Further, it may have a laminated structure formed of these materials.

The gate electrode 3 is formed of for example, polysilicon in which phosphorus is added. The gate electrodes 3 may be for example, a metal gate or a silicide gate. The lower electrode 8 and the upper electrode 10 are formed of for example, ruthenium. Further, as described above, each electrode has to be electrically-conductive. It may be formed of for example, gold, nickel, cobalt, platinum, ruthenium, iridium, titanium, an alloy of these metals or an oxide of these metals, nitride, fluoride, carbide, or silicide.

The transition metal oxide layer (variable resistance layer) 9 may have the laminated structure composed of the titanium oxide layer having a layer thickness of 4 nm and the tantalum oxide layer having a layer thickness of 15 nm Further, in the variable resistance layer 9, the tantalum oxide layer may be arranged at a side of the lower electrode 8 or the tantalum oxide layer may be arranged at the side of the lower electrode 8. Here, the resistance change occurs at the interface between the lower electrode 8 and the titanium oxide layer and the inside of the titanium oxide layer. For this reason, from the viewpoint of reduction of the influence of sputtering damage that occurs when forming the upper electrode 10, it is desirable that the titanium oxide layer is arranged at the side of the lower electrode 8, the tantalum oxide layer is formed on the titanium oxide layer, and after that, the upper electrode 10 is formed.

Next, a processing to the variable resistance layer 9 (a method for operating the variable resistance element) will be described. First, in order to perform the Forming, for example, the control transistor is set in an ON state by applying a positive voltage to the gate electrode 3. Next, the positive voltage is applied to the wiring 14, the positive voltage is applied to the lower electrode 8, and whereby, the variable resistance layer 9 is set to the low resistance state. At this time, by adjusting the voltage applied to the gate electrode 3, a current limiting operation of the control transistor is made operable and the resistance of the variable resistance layer 9 is adjusted to the desired resistance value. Further, in order to perform the Forming, the voltage may be applied to the wiring 15 instead of the wiring 14.

As described above, when the resistance state is switched between the low resistance state and the high resistance state after the Forming has been performed, the predetermined positive voltage is applied to the wiring 14 when the control transistor is in the ON state. When the resistance state is changed to the low resistance state, a voltage higher than the voltage used when changing the resistance state to the high resistance state is applied to the wiring 14. Further, by adjusting the voltage applied to the gate electrode 3, the current limiting operation of the control transistor is made operable and the resistance of the variable resistance layer 9 is adjusted to the desired resistance value. Further, when the resistance state is changed from the high resistance state to the low resistance state, the positive voltage may be applied to the wiring 15 instead of the wiring 14.

Next, a method for manufacturing the above-mentioned storage device will be described.

Figure 17:
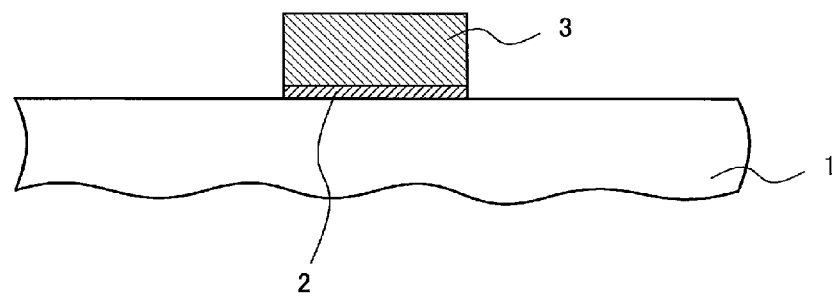
FIG. 17 is a figure showing an example of a method for manufacturing a semiconductor device according to an example 2 of the present invention.

First, as shown in FIG. 17, the gate insulating film 2 and the gate electrode 3 are formed on the semiconductor substrate 1. For example, silicon oxide and phosphorus-doped polysilicon are deposited and a patterning of these films is performed by using a photolithography technology and an etching technology that are publicly known to form the gate insulating film 2 and the gate electrode 3.

Figure 18:
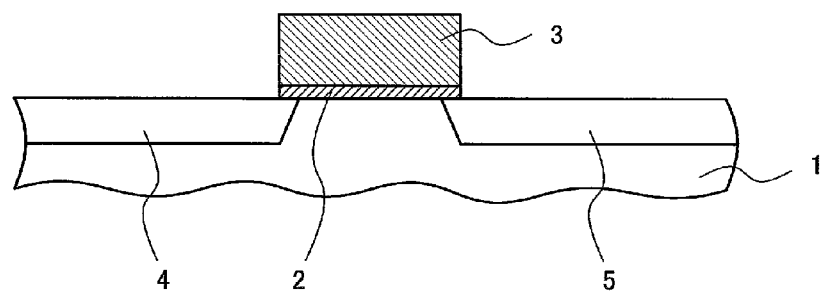
FIG. 18 is a figure showing an example of a method for manufacturing a semiconductor device according to an example 2 of the present invention.

Next, as shown in FIG. 18, the gate electrode 3 is used as a mask, the ion implantation of phosphorus is performed at a dose of $2 \times 10^{15}$ cm-2 (set value), and whereby, the source 4 and the drain 5 are formed.

Figure 19:
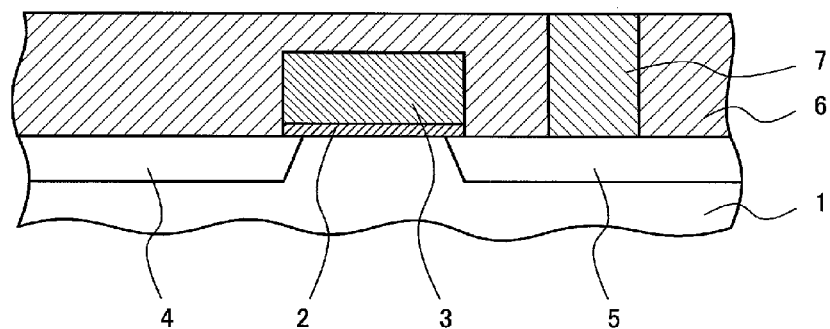
FIG. 19 is a figure showing an example of a method for manufacturing a semiconductor device according to an example 2 of the present invention.

Next, as shown in FIG. 19, silicon oxide is deposited on the whole surface of the semiconductor substrate 1 and the planarization of the surface of this deposited film is performed by using a CMP (Chemical Mechanical Polishing) method to form the interlayer insulation film 6. Next, the contact hole is formed in the interlayer insulation film 6 by using a photolithography technology and an etching technology that are publicly known. Titanium nitride (TiN) and tungsten (W) are deposited to fill the inside of the contact hole. Further, the metallic film on the interlayer insulation film 6 is removed by using the CMP method to form the contact via 7.

Figure 20:
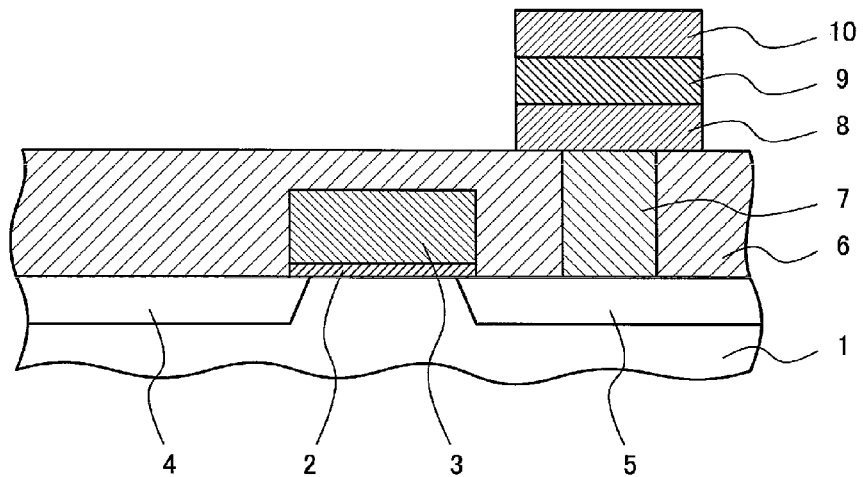
FIG. 20 is a figure showing an example of a method for manufacturing a semiconductor device according to an example 2 of the present invention.

Next, as shown in FIG. 20, the ruthenium layer having a thickness of 40 nm, the titanium oxide layer having a thickness of 4 nm, the tantalum oxide layer having a thickness of 10 nm, and the ruthenium layer having a thickness of 40 nm are deposited in this order on the interlayer insulation film 6 in which the contact via 7 is formed. By performing the patterning of these by using a photolithography technology and an etching technology that are publicly known, the variable resistance element composed of the lower electrode 8, the variable resistance layer 9, and the upper electrode 10 is formed. The DC sputtering method is used for the deposition of the ruthenium layer.

When titanium oxide is formed by using the plasma oxidation method, first, the titanium layer having the film thickness of 2 nm is formed. Titanium is used as the sputtering target and argon gas is supplied in the chamber in which a titanium film is formed at the flow rate of 50 sccm. At this time, the film forming temperature is set to 300 degrees C. and a DC power is set to 0.2 kW. Oxygen gas is supplied in the chamber in which the plasma oxidation is performed at the flow rate of 2800 sccm and exhaust is adjusted so that the pressure is 150 Pa. At this time, the film forming temperature is set to 250 degrees C. and an RF power is set to 2.0 kW. The film thickness of the titanium layer becomes about double by the plasma oxidation and the titanium oxide layer having a film thickness of 4 nm is formed.

The RF spattering device is used to form the tantalum oxide layer. Tantalum oxide is used for the sputtering target. Oxygen gas and argon gas are supplied in the chamber in which the film of the tantalum oxide layer is formed at the flow rate of 5 sccm and 40 sccm, respectively. At this time, the film forming temperature is set to 350 degrees C. and a power is set to 2 kW.

Figure 21:
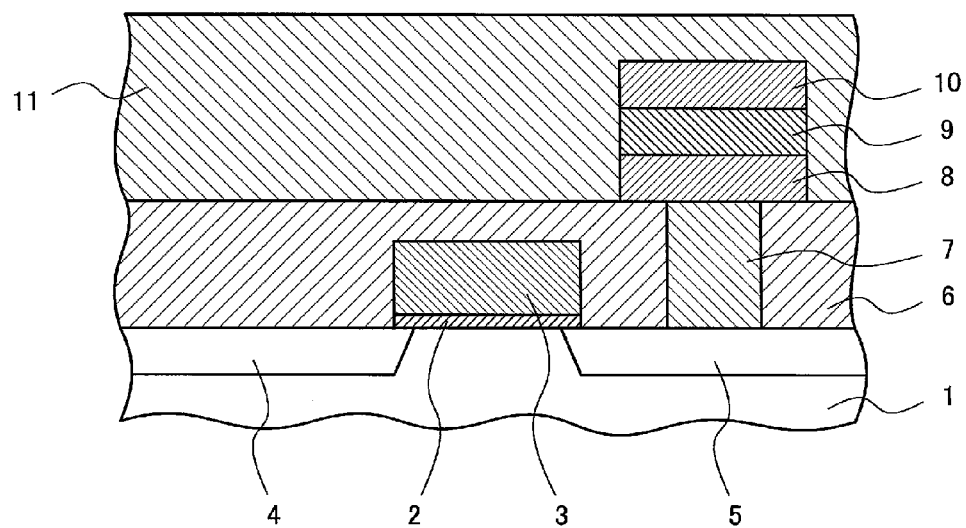
FIG. 21 is a figure showing an example of a method for manufacturing a semiconductor device according to an example 2 of the present invention.

Next, as shown in FIG. 21, silicon oxide is deposited on the interlayer insulation film 6 in which the above-mentioned variable resistance element is formed, the planarization of the surface of this silicon oxide deposition film is performed by using the CMP method to form the interlayer insulation film 11.

Figure 22:
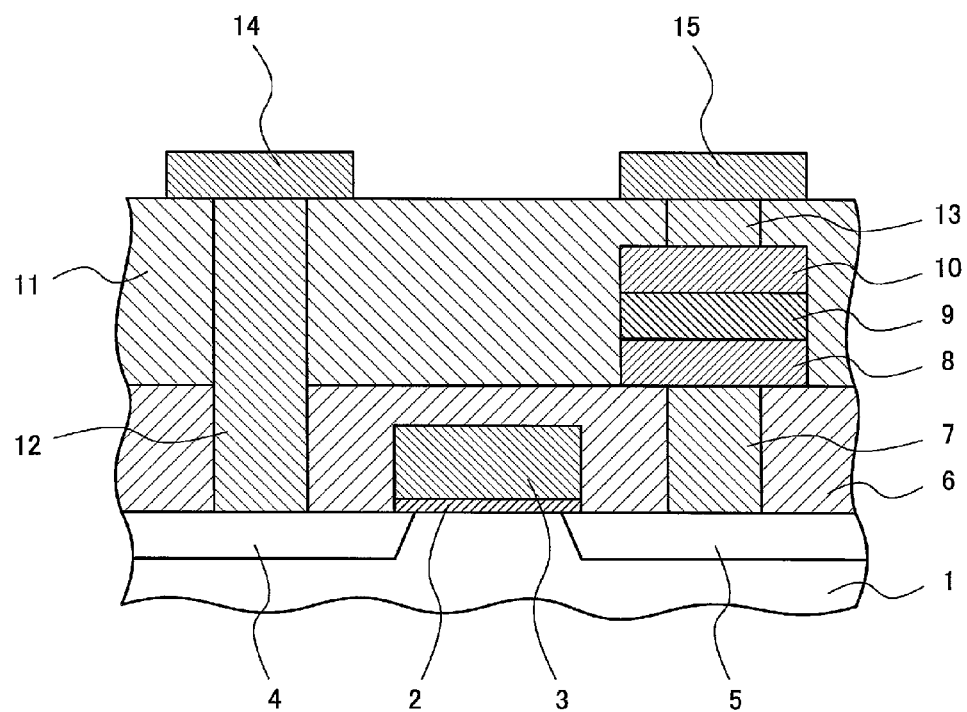
FIG. 22 is a figure showing an example of a method for manufacturing a semiconductor device according to an example 2 of the present invention.

Next, by performing the patterning using a photolithography technology and an etching technology that are publicly known, a through-hole which reaches the source 4 and a through-hole which reaches the upper electrode 10 are formed in the interlayer insulation film 11 and the interlayer insulation film 6. Next, titanium nitride and tungsten are deposited to fill the inside of the through-holes. After this, the planarization of the surface is performed by using the CMP method, titanium nitride and tungsten located at a place other than the through-hole are removed, and whereby, as shown in FIG. 22, the contact via 12 and the via 13 are formed. Titanium nitride and aluminum are deposited on the interlayer insulation film 11 and the patterning of these deposited films is performed by using a photolithography technology and an etching technology that are publicly known to form the wiring 14 and the wiring 15.

The storage device produced by the above-mentioned method has a configuration in which the variable resistance element according to this example is connected to the drain 5 of the control transistor. Therefore, it is useful for realizing high integration. Further, in the storage device, the electric current can be controlled by the gate voltage of the control transistor at the time of applying the voltage for the Forming and at the time of the resistance change from the high resistance to the low resistance in addition to the feature of this example in which the stable resistance change operation with low power consumption can be realized. Therefore, the resistance change operation with a small variation can be realized.

As described above, by using the structure and the manufacturing method described in this example, the semiconductor device which can perform a switching operation at low power consumption and has a stable variable resistance characteristic can be realized.

The present invention has been described according to the above-mentioned exemplary embodiment and example. However, the present invention is not limited to only the above-mentioned exemplary embodiment and the structure shown in the example. Various changes or modifications of the present invention that can be understood by those skilled in the art can be made without departing from the scope of the invention.

Further, this application claims priority based on Japanese Patent Application No. 2009-234810 filed on Oct. 9, 2009, the disclosure of which is hereby incorporated by reference in its entirety.

DESCRIPTION OF SYMBOL 101, 201, and 901 first electrode (lower electrode)
102, 202, and 902 second electrode (upper electrode)
103, 203, and 903 first transition metal oxide layer
104, 204, and 904 second transition metal oxide layer
905 and 906 band diagram
1 semiconductor substrate
2 gate insulating film
3 gate electrode
4 source
5 drain
6, 11, and 16 interlayer insulation film
7 and 12 contact via
8 lower electrode
9 transition metal oxide layer (variable resistance layer)
10 upper electrode
13 via
14 and 15 wiring

The invention claimed is:

1. A semiconductor device, comprising at least a first electrode, a second electrode, and a transition metal oxide layer sandwiched between the first electrode and the second electrode, wherein
 the transition metal oxide layer includes a first transition metal oxide layer formed of a first transition metal and a second transition metal oxide layer formed of a second transition metal different from the first transition metal,
 the first transition metal oxide layer is provided on a first electrode side,
 the second transition metal oxide layer is provided on a second electrode side,
 the first transition metal oxide layer and the second transition metal oxide layer are in contact with each other,
 the first transition metal oxide layer has an oxygen concentration gradient from an interface between the first transition metal oxide layer and the second transition metal oxide layer toward the first electrode side,
 the oxygen concentration at the interface is greater than the oxygen concentration on the first electrode side, and
 a composition of the first transition metal oxide at the interface between the first transition metal oxide layer and the second transition metal oxide layer is a stoichiometric composition.

2. The semiconductor device described in claim 1, wherein the first transition metal oxide layer is amorphous.

3. The semiconductor device described in claim 1, wherein the second transition metal oxide layer is amorphous.

4. The semiconductor device described in claim 1, wherein the first transition metal oxide layer includes any one of titanium oxide, zirconium oxide, and nickel oxide.

5. The semiconductor device described in claim 1, wherein the second transition metal oxide layer includes any one of tantalum oxide, zirconium oxide, and tantalum silicon oxide.

6. The semiconductor device described in claim 1, wherein an absolute value of a free energy of oxidation of the second transition metal is greater than that of the first transition metal.

7. The semiconductor device described in claim 1, wherein the first electrode includes any one of gold, nickel, cobalt, platinum, ruthenium, iridium, titanium, an alloy of these or an oxide of these, nitride, fluoride, carbide, and silicide and
 the second electrode includes any one of gold, nickel, cobalt, platinum, ruthenium, iridium, titanium, an alloy of these or an oxide of these, nitride, fluoride, carbide, and silicide.

8. The semiconductor device described in claim 1, wherein the first electrode includes a metal whose absolute value of a free energy of oxidation is smaller than that of the first transition metal and which is electrically-conductive after it is oxidized.

\* \* \* \* \*